United States Patent
Mohri et al.

(10) Patent No.: US 10,217,990 B2
(45) Date of Patent: *Feb. 26, 2019

(54) SILICON MATERIAL AND NEGATIVE ELECTRODE OF SECONDARY BATTERY

(71) Applicant: KABUSHIKI KAISHA TOYOTA JIDOSHOKKI, Kariya-shi, Aichi (JP)

(72) Inventors: Takashi Mohri, Kariya (JP); Masanori Harata, Kariya (JP); Masataka Nakanishi, Kariya (JP); Hiroki Oshima, Kariya (JP); Nobuhiro Goda, Kariya (JP)

(73) Assignee: KABUSHIKI KAISHA TOYOTA JIDOSHOKKI, Kariya-shi, Aichi (JP)

( * ) Notice: Subject to any disclaimer, the term of this patent is extended or adjusted under 35 U.S.C. 154(b) by 4 days.

This patent is subject to a terminal disclaimer.

(21) Appl. No.: 15/314,246

(22) PCT Filed: May 26, 2015

(86) PCT No.: PCT/JP2015/002653
§ 371 (c)(1),
(2) Date: Nov. 28, 2016

(87) PCT Pub. No.: WO2015/182124
PCT Pub. Date: Dec. 3, 2015

(65) Prior Publication Data
US 2017/0194623 A1 Jul. 6, 2017

(30) Foreign Application Priority Data

May 29, 2014 (JP) ................................ 2014-110835

(51) Int. Cl.
*H01M 4/02* (2006.01)
*H01M 10/02* (2006.01)
(Continued)

(52) U.S. Cl.
CPC ............. *H01M 4/02* (2013.01); *C01B 33/021* (2013.01); *H01L 29/40* (2013.01); *H01M 4/134* (2013.01);
(Continued)

(58) Field of Classification Search
CPC .... H01M 4/386; H01M 10/0525; H01M 4/48; H01M 2004/027; H01M 2004/021;
(Continued)

(56) References Cited

U.S. PATENT DOCUMENTS

| 4,392,011 A | 7/1983 | Pankove et al. |
| 5,525,556 A | 6/1996 | Dunmead et al. |

(Continued)

FOREIGN PATENT DOCUMENTS

| EP | 2 819 179 A1 | 12/2014 |
| JP | 2005-142440 A | 6/2005 |

(Continued)

OTHER PUBLICATIONS

Janotta Andreas et al: "Light-induced modification of a-SiOx II: Laser crystallization", Journal of Applied Physics, American Institute of Physics, US, vol. 95, No. 8, Apr. 15, 2004, pp. 4060-4068, XP012067751, (9 pages total).

(Continued)

*Primary Examiner* — Peter F Godenschwager
*Assistant Examiner* — Andrew J. Oyer
(74) *Attorney, Agent, or Firm* — Sughrue Mion, PLLC

(57) ABSTRACT

A silicon material useful as a negative electrode active material is provided.
The silicon material has an Si/O atom ratio within a range of greater than 1/0.5 and not greater than 1/0.1 and a band gap within a range of greater than 1.1 eV and not greater than 2.1

(Continued)

eV. A secondary battery in which this silicon material is used as a negative electrode active material has long life.

10 Claims, 3 Drawing Sheets

(51) Int. Cl.
  H01M 4/134    (2010.01)
  H01L 29/40    (2006.01)
  H01M 4/48     (2010.01)
  C01B 33/031   (2006.01)
  H01M 4/38     (2006.01)
  H01M 4/36     (2006.01)
  C01B 33/021   (2006.01)

(52) U.S. Cl.
  CPC ........... *H01M 4/362* (2013.01); *H01M 4/386* (2013.01); *H01M 4/483* (2013.01); *H01M 10/02* (2013.01); *H01M 2004/021* (2013.01)

(58) Field of Classification Search
  CPC ..... C01B 33/12; C01B 33/02; C01P 2006/12; C01P 2006/40
  See application file for complete search history.

(56) References Cited

U.S. PATENT DOCUMENTS

| | | | |
|---|---|---|---|
| 6,207,969 | B1 | 3/2001 | Yamazaki |
| 2001/0012503 | A1 | 8/2001 | Fukuoka et al. |
| 2004/0166046 | A1 | 8/2004 | Fukuoka et al. |
| 2008/0050573 | A1 | 2/2008 | Nakano et al. |
| 2008/0166634 | A1* | 7/2008 | Kim .................... H01M 4/131 429/218.1 |
| 2009/0093356 | A1 | 4/2009 | Yamamoto |
| 2009/0186267 | A1 | 7/2009 | Tiegs |
| 2016/0006022 | A1 | 1/2016 | Yukawa |

FOREIGN PATENT DOCUMENTS

| | | |
|---|---|---|
| JP | 3865033 B2 | 1/2007 |
| JP | 2009-102219 A | 5/2009 |
| JP | 2011-90806 A | 5/2011 |
| JP | 2014-022319 A | 2/2014 |
| WO | 2006/009073 A1 | 1/2006 |
| WO | 2012/057253 A1 | 5/2012 |
| WO | 2013/125831 A1 | 8/2013 |

OTHER PUBLICATIONS

Communication dated Apr. 11, 2017, issued from the Europe Patent Office in corresponding European Patent Application No. 15800022.4.
U.S. Appl. No. 15/314,309, Kabushiki Kaisha Toyota Jidoshokki, filed Nov. 28, 2016.
U.S. Appl. No. 15/314,369, Kabushiki Kaisha Toyota Jidoshokki, filed Nov. 28, 2016.
Communication dated Jun. 19, 2017, issued from the Korean Intellectual Property Office in corresponding Application No. 10-2016-7031287.
Holzenkämpfer, E. et al., "Electron Spin Resonance and Hopping Conductivity of a-SiO$_x$," Journal of Non-Crystalline Solids, vol. 32, 1979, pp. 327-338, (12 pages total).
Communication dated Dec. 25, 2017 from the Russian Patent and Trademark Office in related application No. 2016151175/07.
Communication dated Dec. 21, 2017 from the Korean Intellectual Property Office in related application No. 10-2016-7031286.
H. D. Fuchs, et al., "Porous silicon and siloxene: Vibrational and structural properties", Physical Review B, Sep. 15, 1993, 19 pages, vol. 48, No. 11. pp. 8172-8189.
Shoji Yamanaka, et al., "New Deintercalation Reaction of Calcium From Calcium Disilicide Synthesis of Layered Polysilane", Materials Research Bulletin, 1996, pp. 307-316, vol. 31, No. 3.
Communication dated Dec. 25, 2017 from the Russian Patent and Trademark Office in counterpart application No. 2016151175/07.
Communication dated Dec. 21, 2017 from the Korean Intellectual Property Office in counterpart application No. 10-2016-7031286.
Communication dated Jan. 18, 2018 from the European Patent Office in related application No. 15800565.2.
Bacioglu et al., "Deposition of highly photoconductive wide band gap a-SiO$_x$:H thin films at a high temperature without H$_2$-dilution", Solar Energy Materials & Solar Cells, vol. 89, 2005, pp. 49-59.
Fukutani et al., "Extremely Narrow Band Gap,~1.50eV, Amorphous Silicon", Mat. Res. Soc. Symp. Proc., vol. 507, 1998, pp. 211-216.
Futako et al., "Fabrication of high quality silicon related films with band-gap of 1.5 eV by chemical annealing", Journal of Non-Crystalline Solids, vol. 198-200, 1996, pp. 1046-1049.
Futako et al., "The structure of 1.5-2.0 eV band gap amorphous silicon films prepared by chemical annealing", Journal of Non-Crystalline Solids, vol. 266-269, 2000, pp. 630-634.
Hazra et al., "Highly photosensitive helium diluted amorphous silicon 1.5 eV band gap: Role of pressure", Journal of Applied Physics, vol. 78, Jul. 1, 1995, pp. 581-583.
Communication dated Mar. 23, 2018, from State Intellectual Property Office of the P.R.C. in related application No. 201580027645.7.
An Office Action dated Apr. 23, 2018, which issued during the prosecution of U.S. Appl. No. 15/314,369.
Communication dated Jun. 28, 2018, issued by the Korean Intellectual Property Office in related Korean Application No. 10-2016-7031286.
Hirotaka Okamoto, et al., "Synthesis and Modification of Silicon Nanosheets and Other Silicon Nanomaterials", Chemistry of European Journal, vol. 17, 2011, pp. 9864-9887 (24 pages total).
W.D.A.M. de Boer, et al., "Red spectral shift and enhanced quantum efficiency in phonon-free photoluminescence from silicon nanocrystals", Nature Nanotechnology, vol. 5, Dec. 2010, pp. 878-884 (7 pages total).
D.M. Wolfe et al., "Formation of nano-crystalline Si by thermal annealing of SiOx, SiCx and SiOyCx amorphous alloys: model systems for advanced device processing," Journal of Non-Crystalline Solids 266-269 (2000), pp. 1009-1014 (6 pages total).
Office Action dated Jul. 27, 2018 in copending U.S. Appl. No. 15/314,369.
Janotta et al., "Light-induced modification of a-SiOx: H. I: Metastability", Journal of Applied Physics, American Institute of Physics, US, vol. 95, No. 8, Apr. 15, 2004, doi:10.1063/1.1667007,4046-4059 (15 pages total).
Communication dated Aug. 29, 2018, issued by the Intellectual Property Office of India in counterpart Application No. 201647039942.

\* cited by examiner

SILICON MATERIAL AND NEGATIVE ELECTRODE OF SECONDARY BATTERY

CROSS REFERENCE TO RELATED APPLICATIONS

This application is a National Stage of International Application No. PCT/JP2015/002653, filed on May 26, 2015, which claims priority from Japanese Patent Application No. 2014-110835, filed on May 29, 2014, the contents of all of which are incorporated herein by reference in their entirety.

TECHNICAL FIELD

The present invention relates to a silicon material used as the negative electrode active material of a lithium ion secondary battery or the like, a negative electrode active material containing the silicon material, and a secondary battery using the negative electrode active material.

BACKGROUND ART

Lithium ion secondary batteries are secondary batteries having a high charge/discharge capacity and capable of achieving high output. Currently, lithium ion secondary batteries are mainly used as power supplies for portable electronic equipment, and are expected to be used as power supplies for electric vehicles assumed to be used widely in the future. Lithium ion secondary batteries have, respectively in a positive electrode and a negative electrode, active materials capable of inserting and eliminating lithium (Li) therein/therefrom. The lithium ion secondary batteries operate when lithium ions move through an electrolytic solution provided between the two electrodes.

In lithium ion secondary batteries, a lithium-containing metallic complex oxide such as a lithium cobalt complex oxide is mainly used as the active material for the positive electrode, and a carbon material having a multilayer structure is mainly used as the active material for the negative electrode. The performance of a lithium ion secondary battery is influenced by materials of the positive electrode, the negative electrode, and the electrolyte that are included in the secondary battery. Research and development are actively conducted for active material substances forming the active materials. For example, usage of silicon or a silicon oxide having a higher capacity than carbon is discussed as a substance for the negative electrode active material.

When silicon is used as the negative electrode active material, a battery with a capacity higher than when a carbon material is used is obtained. However, silicon undergoes a large volume change associated with occlusion and release of Li during charging and discharging. Thus, in a secondary battery in which silicon is used as a negative electrode active material, silicon turns into fine powder to undergo a structural change during charging and discharging and becomes eliminated or detached from a current collector as a result. Therefore, this secondary battery has a problem of short charge/discharge cycle life of the battery. For that reason, a technique to suppress a volume change associated with occlusion and release of Li during charging and discharging by using a silicon oxide as a negative electrode active material, as compared to silicon, is discussed.

For example, usage of a silicon oxide ($SiO_x$: x is about $0.5 \leq x \leq 1.5$) is discussed as the negative electrode active material. $SiO_x$, when being heated, is known to decompose into Si and $SiO_2$. This is referred to as a disproportionation reaction in which a solid separates into two phases, i.e., Si phase and $SiO_2$ phase, through an internal reaction. The Si phase obtained from the separation is extremely fine. In addition, the $SiO_2$ phase that covers the Si phase has a function of suppressing decomposition of the electrolytic solution. Thus, the secondary battery using the negative electrode active material formed of $SiO_x$ that has been decomposed into Si and $SiO_2$ has excellent cycle characteristics.

The cycle characteristics of the secondary battery improve further when finer silicon particles forming the Si phase of the $SiO_x$ described above are used as a negative electrode active material in the secondary battery. JP3865033 (B2) (Patent Literature 1) discloses a method of heating metal silicon and $SiO_2$ to sublimate those into a silicon oxide gas, and cooling the gas to produce $SiO_x$.

JP2009102219 (A) (Patent Literature 2) discloses a production method including decomposing a silicon raw material into an elemental state in a high temperature plasma, rapidly cooling it to the temperature of liquid nitrogen to obtain silicon nano particles, and fixing the silicon nano particles into a $SiO_2$—$TiO_2$ matrix by using a sol-gel method or the like.

In the production method disclosed in Patent Literature 1, the materials are limited to sublimable materials. Moreover, irreversible Li is known to be generated at the negative electrode due to change of the $SiO_2$ phase, which covers the Si phase, into lithium silicate at the time of Li occlusion, and thus it is necessary to add an extra active material to the positive electrode. In addition, in the production method disclosed in Patent Literature 2, high energy is required for plasma discharge. Furthermore, silicon complexes obtained from these production methods have a flaw of the silicon particles of the Si phase having low dispersibility and being easily aggregated. When the silicon particles aggregate with each other and the particle sizes thereof become large, the secondary battery using those as the negative electrode active material results in having a low initial capacity and deteriorated cycle characteristics.

In recent years, silicon materials that are expected for usage in semiconductors, electrics or electronics fields, and the like have been developed. For example, Physical Review B (1993), vol. 48, pp. 8172-8189 (Non-Patent Literature 1) discloses a method for synthesizing a layered polysilane by causing a reaction between hydrogen chloride (HCl) and calcium disilicide ($CaSi_2$), and states that the layered polysilane obtained in this manner can be used in a light-emitting element or the like.

Materials Research Bulletin, Vol. 31, No. 3, pp. 307-316, 1996 (Non-Patent Literature 2) states that plate-like silicon crystal was obtained by performing a heat treatment at 900° C. on a layered polysilane obtained by causing a reaction between hydrogen chloride (HCl) and calcium disilicide ($CaSi_2$).

JP2011090806 (A) (Patent Literature 3) discloses a lithium ion secondary battery in which a layered polysilane is used as a negative electrode active material.

CITATION LIST

Patent Literature

Patent Literature 1: JP3865033 (B2)
Patent Literature 2: JP2009102219 (A)
Patent Literature 3: JP2011090806 (A)

Non-Patent Literature

Non-Patent Literature 1: Physical Review B (1993), vol. 48, pp. 8172-8189

Non-Patent Literature 2: Materials Research Bulletin, vol. 31, No. 3, pp. 307-316, 1996

SUMMARY OF INVENTION

Technical Problem

In a secondary battery such as a lithium ion secondary battery, a high capacity is achieved by using silicon or $SiO_x$ as a negative electrode active material. However, a secondary battery in which silicon or $SiO_x$ is used as a negative electrode active material has insufficient life and insufficient initial efficiency, etc. in some cases, and thus has not been put into practical use. Therefore, achievement of both improvement of initial efficiency and extension of life when the above-described silicon material is used as the negative electrode active material of a secondary battery, is desired. In particular, a new silicon material useful as a negative electrode active material with which the capacity of a secondary battery can be suitably maintained, is desired.

Solution to Problem

The inventors of the present application have thoroughly investigated the characteristics of a lithium ion secondary battery in which a silicon material obtained by performing a heat treatment on a layered silicon compound was used as a negative electrode active material. As a result, the inventors of the present application have found that the life (cycle characteristics) that is one of battery characteristics is greatly influenced by the band gap of the silicon material, and have accomplished the present invention.

That is, a silicon material of the present invention solving the above-described problem has an Si/O atom ratio within a range of greater than 1/0.5 and not greater than 1/0.1 and a band gap within a range of greater than 1.1 eV and not greater than 2.1 eV.

A secondary battery of the present invention includes a negative electrode containing a negative electrode active material using the silicon material of the present invention.

Advantageous Effects of Invention

The silicon material of the present invention is useful as the negative electrode active material of a secondary battery using a nonaqueous electrolytic solution. A secondary battery in which the silicon material of the present invention is used as a negative electrode active material has a suitably maintained capacity and thus has long life.

DESCRIPTION OF EMBODIMENTS

<Silicon Material>

Figure 1:
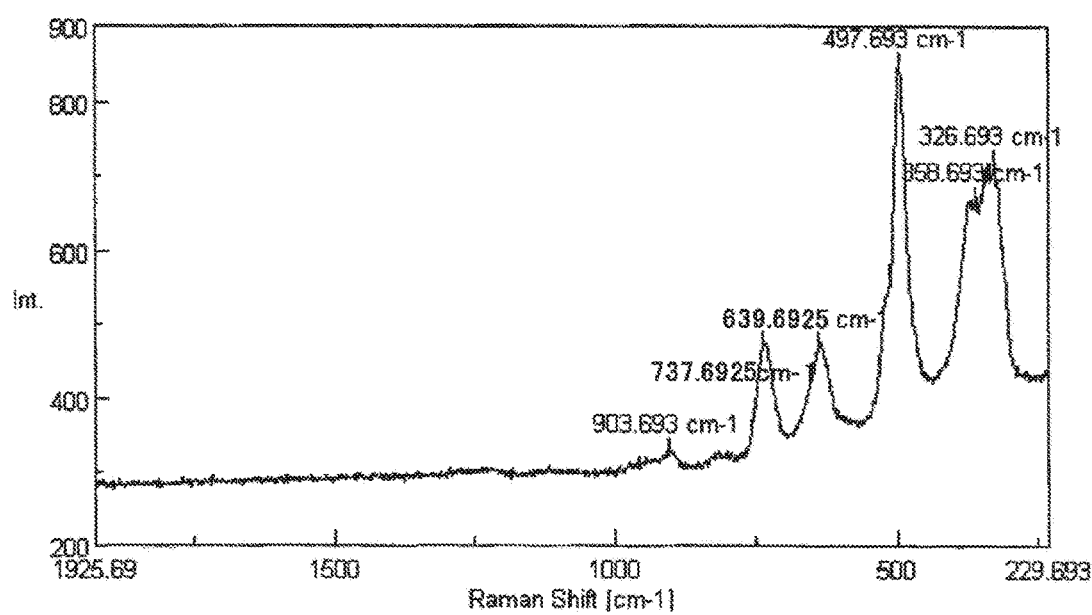
FIG. 1 is a Raman spectrum of a layered silicon compound.

A silicon material of the present invention has a band gap within the range of greater than 1.1 eV and not greater than 2.1 eV. The band gap is particularly desirably within the range of 1.2 eV to 1.6 eV. Non-Patent Literature 2 described above states that a band gap was calculated, and also states that the band gap of the silicon material changes depending on the annealing conditions for the layered silicon compound. However, Non-Patent Literature 2 neither describes nor suggests a relationship between the band gap and battery characteristics.

The inventors of the present application have found that the life of a secondary battery improves with the initial efficiency of the secondary battery maintained high to some extent, by using a silicon material having an Si/O atom ratio within the range of greater than 1/0.5 and not greater than 1/0.1 and also a band gap within the range of greater than 1.1 eV and not greater than 2.1 eV, as a negative electrode active material in the secondary battery. The band gap may be calculated from the absorption edge wavelength of a light absorption spectrum of the silicon material.

The silicon material of the present invention has an Si/O atom ratio in the composition thereof within the range of greater than 1/0.5 and not greater than 1/0.1. The Si/O atom ratio is more desirably within the range of 1/0.4 to 1/0.2. It is difficult to produce a silicon material having an Si/O atom ratio of greater than 1/0.1. When the Si/O atom ratio is not greater than 1/0.5, the initial capacity and initial efficiency of a secondary battery in which the silicon material is used as a negative electrode active material decrease in some cases. The Si/O atom ratio may be calculated from TEM-EDX data.

The silicon material of the present invention preferably contains silicon crystallites. The silicon crystallites have a crystallite size of preferably 0.5 nm to 300 nm, further preferably 1 nm to 30 nm, and particularly preferably 1 nm to 10 nm. If the crystallite size is greater than 300 nm, when the silicon material is used as the negative electrode active material of a secondary battery, the battery capacity decreases in some cases. The crystallite size is calculated in accordance with Scherrer's equation from the half width of a diffraction peak (present at a position at which 2θ is 27° to 30°) of the (111) plane in an X-ray diffraction measurement result.

The silicon material of the present invention may be complex particles further containing at least one of amorphous silicon, a silicon oxide ($SiO_x$, 0<x<2), or a silicon compound, in addition to silicon crystallites. In the complex particles, the silicon crystallites are present on the surface of and/or within the at least one of the amorphous silicon, the silicon oxide ($SiO_x$, 0<x<2), or the silicon compound. For example, the silicon crystallites may be dispersed in an island state within a matrix mainly formed from amorphous silicon, or may adhere to the surfaces of particles mainly formed from amorphous silicon, in an island state.

If the silicon crystallite concentration in the complex particles is excessively low, when the silicon material is used as the negative electrode active material of a secondary battery, the initial capacity becomes low. In addition, if the silicon crystallite concentration is excessively high, the expansion/contraction amount of the entire active material becomes large, so that the life (cycle characteristics) worsens in some cases.

The particle diameter of the silicon material (complex particles) of the present invention is not particularly limited. When the silicon material (complex particles) of the present invention is used as the negative electrode active material of a secondary battery, a silicon material classified into the range of 2 μm to 20 μm is preferably used.

The silicon material of the present invention also preferably contains fluorine (F). By containing fluorine, the amount of chlorine (Cl) or oxygen (O) contained therein is reduced. When the silicon material is used as the negative electrode active material of a secondary battery, a reaction between chlorine or oxygen and lithium or the like is reduced. The amount of fluorine contained in the silicon material may be within the range of 0.01 to 10 mass %. When the fluorine amount is smaller than this range, the amount of chlorine (Cl) or oxygen (O) becomes large, so that the conductive resistance increases, and the initial efficiency of a secondary battery in which such a silicon material is used as a negative electrode active material decreases. Furthermore, when the fluorine amount in the silicon material is larger than this range, the capacity of a secondary battery in which this silicon material is used as a negative electrode active material decreases in some cases. The amount of fluorine contained in the silicon material is particularly preferably within the range of 1 to 5 mass %.

In consideration of the battery characteristics obtained when the silicon material of the present invention is used as the negative electrode active material of a secondary battery, the silicon material of the present invention has a BET specific surface area of preferably 3 to 100 $m^2/g$, further preferably 4 to 80 $m^2/g$, and particularly preferably 7 to 60 $m^2/g$. The silicon material of the present invention desirably has an oxygen (O) amount of not greater than 20 mass %. Whereas the oxygen amount in silicon obtained by performing a heat treatment on the layered silicon compound disclosed, for example, in Non-Patent Literature 1 or 2 is about 33 mass % and is large, the oxygen amount of the silicon material containing fluorine is not greater than 30 mass % and is small.

<Production Method for Silicon Material>

The silicon material of the present invention is produced by performing a heat treatment in a non-oxidizing atmosphere at about 350° C. to 950° C. on a layered silicon compound obtained by causing a reaction between an acid and $CaSi_2$. As the acid to be used, hydrochloric acid (HCl) may be used as described in Non-Patent Literature 2, or an acid containing fluorine at least in the anion thereof is preferably used. By using the acid containing fluorine at least in the anion thereof, the amounts of oxygen (O) contained in the layered silicon compound and the silicon material are reduced. In addition, by containing fluorine (F), the chlorine (Cl) amount becomes zero or is reduced. Therefore, when the silicon material of the present invention containing fluorine is used as the negative electrode active material of a lithium ion secondary battery or the like, the initial capacity suitably improves.

Thus, as the production method for the silicon material, a heat treatment is preferably performed in a non-oxidizing atmosphere at a temperature of not lower than 350° C. on a layered silicon compound obtained by causing a reaction between $CaSi_2$ and a chemical solution containing an acid containing fluorine at least in the anion thereof.

Examples of the acid containing fluorine at least in the anion thereof include hydrofluoric acid, tetrafluoroboric acid, hexafluorophosphoric acid, hexafluoroarsenic acid, fluoroantimonic acid, hexafluorosilicic acid, hexafluorogermanic acid, hexafluorostannic (IV) acid, trifluoroacetic acid, hexafluorotitanic acid, hexafluorozirconic acid, trifluoromethanesulfonic acid, and fluorosulfonic acid, etc.

Another acid may be contained when at least one acid selected from the above acids is contained. Examples of the other acid include hydrochloric acid, hydrobromic acid, hydroiodic acid, sulfuric acid, methanesulfonic acid, nitric acid, phosphoric acid, formic acid, and acetic acid, etc.

The reaction between $CaSi_2$ and the chemical solution containing the acid containing fluorine at least in the anion thereof may be carried out under conditions that are the same as those described in Non-Patent Literature 1 and 2. The reaction is preferably carried out at a low temperature equal to or lower than room temperature, and desirably carried out on an ice bath. The obtained layered silicon compound has a smaller oxygen amount than a layered silicon compound obtained by the method disclosed in Non-Patent Literature 1 or 2, and contains fluorine.

Hereinafter, a step of producing the layered silicon compound is sometimes referred to as a layered silicon compound producing step.

In the layered silicon compound producing step, when hydrofluoric acid (HF) is used as the acid containing fluorine at least in the anion thereof, hydrochloric acid (HCl) is preferably mixed therewith and used. Even when only hydrofluoric acid (HF) is used, a layered silicon compound is obtained. However, the obtained layered silicon compound has high activity, and becomes oxidized by a very small amount of air to increase the oxygen amount. Thus, using only hydrofluoric acid (HF) is not preferable. In addition, the case of using only hydrochloric acid (HCl) is the same as in Non-Patent Literature 1 and 2, and only a layered silicon compound having a large oxygen amount is obtained in such a case.

The composition ratio between hydrofluoric acid (HF) and hydrochloric acid (HCl) is desirably within the range of HF/HCl=1/1 to 1/100 in mole ratio. Having an amount of hydrofluoric acid (HF) larger than that described in this ratio is not preferable, since a large amount of impurities such as $CaF_2$ and CaSiO-type may be generated and it is difficult to separate the layered silicon compound from these impurities. Furthermore, when the amount of hydrogen fluoride (HF) is smaller than that described in this ratio, the etching action by hydrofluoric acid (HF) with respect to Si—O bond becomes weak, and a large amount of oxygen remains in the obtained layered silicon compound in some cases.

The blend ratio between calcium disilicide ($CaSi_2$) and the mixture of hydrofluoric acid (HF) and hydrochloric acid (HCl) is desirably excessive for the acid than equivalency. In addition, the reaction atmosphere is desirably a vacuum or inert gas atmosphere. Furthermore, using this layered silicon compound producing step has been shown to shorten the reaction time compared to that with the production method in Non-Patent Literature 1 or 2. An excessively long reaction time causes additional reaction between Si and HF to generate $SiF_4$. Thus, a reaction time of about 0.25 to 24 hours is sufficient. Although $CaCl_2$ or the like is generated from the reaction, $CaCl_2$ or the like is easily removed through rinsing with water, so that refinement of the layered silicon compound is easy.

In the layered silicon compound producing step, when, for example, tetrafluoroboric acid ($HBF_4$) is used as the acid containing fluorine at least in the anion thereof, it is not necessary to mix hydrochloric acid (HCl) therewith, and reaction between calcium disilicide ($CaSi_2$) and only tetrafluoroboric acid ($HBF_4$) is allowed to be carried out. The reaction conditions may be the same as described above. With this method, the obtained layered silicon compound and silicon material do not contain chlorine (Cl). Thus, when the silicon material of the present invention is used as a negative electrode active material, the resistance is further reduced.

In a Raman spectrum of the layered silicon compound obtained in the above-described layered silicon compound producing step, peaks are present at 330±20 cm$^{-1}$, 360±20 cm$^{-1}$, 498±20 cm$^{-1}$, 638±20 cm$^{-1}$, and 734±20 cm$^{-1}$ of Raman shift. The layered silicon compound is mainly composed of a structure that is represented by a composition formula (SiH)$_n$ and in which a plurality of six-membered rings formed from silicon atoms are connected.

Subsequent to the above-described layered silicon compound producing step, a heat treatment is performed on the obtained layered silicon compound. The heat treatment is performed in a non-oxidizing atmosphere. Examples of the non-oxidizing atmosphere include a reduced pressure atmosphere, a vacuum atmosphere, and an inert gas atmosphere. In addition, when the heat treatment temperature is excessively high, the BET specific surface area of an obtained silicon material is excessively low in some cases, and when the heat treatment temperature is excessively low, generation of a silicon material is difficult in some cases. Thus, the heat treatment temperature is preferably within the range of equal to or higher than 350° C. and lower than 950° C., and particularly preferably within the range of not lower than 400° C. and not higher than 800° C.

By performing the heat treatment in the non-oxidizing atmosphere on the layered silicon compound obtained by causing a reaction between the acid and CaSi$_2$, a silicon material is obtained. Depending on the conditions, a silicon material containing nano-sized silicon crystallites is obtained. The time of the heat treatment depends on the heat treatment temperature, and may be 1 to 48 hours and preferably 2 to 12 hours when the heat treatment temperature is not lower than 500° C.

<Negative Electrode of Secondary Battery>

The silicon material of the present invention can be used as a negative electrode active material in a secondary battery such as a lithium ion secondary battery. The negative electrode of, for example, a nonaqueous secondary battery is produced, using the silicon material of the present invention, by: applying, on the current collector using a method such as roll coating method, dip coating method, doctor blade method, spray coating method, or curtain coating method, a slurry obtained through adding and mixing a negative electrode active material powder containing the silicon material of the present invention, the conductive additive such as a carbon powder, a binder, and a proper amount of an organic solvent; and drying or curing the binder.

As the negative electrode active material powder contained in the slurry, a powder having a particle diameter classified into the range of 2 μm to 20 μm is preferably used. When a powder having a particle diameter of less than 2 μm is contained, the contact interface with an electrolytic solution increases, so that a degradation product of the electrolytic solution increases during use as a secondary battery in some cases. Particles having a particle diameter of greater than 20 μm have increased stress at the outermost shell thereof, and a negative electrode active material layer becomes broken or comes off in some cases. Furthermore, the thickness of the negative electrode active material layer depends on the particle diameter of the negative electrode active material, and control of the thickness is difficult in some cases. As the method of the classification, a method known in the art may be used.

Although the binder is demanded to bind the active material or the like with the smallest possible amount, the added amount of the binder is desirably 0.5 mass % to 50 mass % of the total amount of the active material, the conductive additive, and the binder. Moldability of an electrode deteriorates when the amount of the binder is less than 0.5 mass %, whereas the energy density of an electrode decreases when the amount of the binder is greater than 50 mass %.

As the binder, both a solvent-based binder and a water-based binder may be used. Examples of the solvent-based binder include polyvinylidene difluoride (PVdF), polytetrafluoroethylene (PTFE), styrene-butadiene rubber (SBR), polyimide (PI), polyamide-imide (PAI), polyamide (PA), polyvinyl chloride (PVC), polymethacrylic acid (PMA), polyacrylonitrile (PAN), modified polyphenylene oxide (PPO), polyethylene oxide (PEO), polyethylene (PE), and polypropylene (PP), etc.

The water-based binder refers to a binder that is mixed and used with an active material in a state where the binder is dispersed or dissolved in water, and, as typical examples of the water-based binder, polyacrylic acid (PAA), styrene-butadiene rubber (SBR), sodium alginate, and ammonium alginate may be used. One obtained by mixing carboxymethylcellulose (CMC) into each of these binders may be used as the water-based binder, or instead of SBR and/or PAA, CMC may be used singly as the water-based binder. In addition, as the water-based binder, a crosslinked product of a water-soluble polymer may be used, and a water-soluble cellulose ester crosslinked product such as a CMC crosslinked product, and a starch/acrylic acid graft polymer, etc. may be used.

When polyvinylidene difluoride is used as the binder, the potential of the negative electrode is reduced and the voltage of the secondary battery improves. Furthermore, using polyamide-imide (PAI) or polyacrylic acid (PAA) as the binder improves initial efficiency and discharge capacity in some cases.

The current collector refers to a fine electron conductor that is chemically inert for continuously sending a flow of current to the electrode during discharge or charging. The current collector may be used in the form of a foil, a plate, or the like. However, the form is not particularly limited as long as the form is in accordance with the purpose. As the current collector, for example, a copper foil or an aluminum foil may be suitably used.

Regarding the negative electrode active material, a material known in the art such as graphite, hard carbon, silicon, carbon fibers, tin (Sn), and silicon oxides may be mixed into the silicon material of the present invention.

Among these materials, a silicon oxide represented by SiO$_x$ (0.3≤x≤1.6) is particularly preferable. Each particle of a powder of this silicon oxide is formed from fine Si and SiO$_2$ covering the Si as a result of a disproportionation reaction. When x is less than the lower limit value, the Si ratio becomes high, so that the volume change during charging and discharging becomes excessively large and the cycle characteristics deteriorate. Furthermore, when x is greater than the upper limit value, the Si ratio decreases, so that the energy density decreases. The range of 0.5≤x≤1.5 is preferable, and the range of 0.7≤x≤1.2 is further preferable.

In addition, as the negative electrode active material, a material obtained by compositing 1 to 50 mass % of a carbon material with respect to SiO$_x$ may be used. By compositing the carbon material, the cycle characteristics of the secondary battery improve. When the composited amount of the carbon material is less than 1 mass %, the effect of improvement of electrical conductivity is not obtained. When the composited amount of the carbon material is greater than 50 mass %, the proportion of SiO$_x$ becomes relatively low and the negative-electrode capacity decreases. The composited amount of the carbon material with respect to SiO$_x$ is preferably within the range of 5 to 30 mass % and further preferably within the range of 5 to 20 mass % CVD or the like may be used for compositing the carbon material with respect to $SiO_x$.

The mean particle diameter of the silicon oxide powder is preferably within the range of 1 μm to 10 μm. When the mean particle diameter is larger than 10 μm, the durability of the nonaqueous secondary battery deteriorates. When the mean particle diameter is smaller than 1 μm, the durability of the nonaqueous secondary battery similarly deteriorates in some cases, since the silicon oxide powder aggregates to generate bulky particles.

The conductive additive is added for increasing the electrical conductivity of the electrode. As the conductive additive to be added, carbonaceous fine particles such as carbon black, natural graphite, granulated graphite, artificial graphite, fire-resistant graphite, acetylene black (AB), Ketchen black (KB) (registered trademark), and vapor grown carbon fiber (VGCF) may be used singly, or two or more types of them may be used in combination. The usage amount of the conductive additive is not particularly limited, but may be, for example, about 20 to 100 parts by mass with respect to 100 parts by mass of the active material. When the amount of the conductive additive is less than 20 parts by mass, an efficient electrically-conductive path is not formed, and when the amount of the conductive additive is greater than 100 parts by mass, moldability of the electrode worsens and the energy density of the electrode becomes low. When a silicon oxide composited with a carbon material is used as the active material, the added amount of the conductive additive may be reduced or may be zero.

The organic solvent is not particularly limited, and a mixture of a plurality of solvents may be used. The organic solvent is particularly preferably, for example, N-methyl-2-pyrrolidone, a mixed solvent of N-methyl-2-pyrrolidone and an ester based solvent (ethyl acetate, n-butyl acetate, butyl cellosolve acetate, butyl carbitol acetate, etc.) or a mixed solvent of N-methyl-2-pyrrolidone and a glyme based solvent (diglyme, triglyme, tetraglyme, etc.).

When the secondary battery of the present invention is a lithium ion secondary battery, the negative electrode may be predoped with lithium. For the doping of the negative electrode with lithium, for example, an electrode forming method of assembling a half cell using metal lithium as a counter electrode, and electrochemically doping with lithium may be used. The degree of doping with lithium is not particularly limited.

When the secondary battery of the present invention is a lithium ion secondary battery, a not-particularly limited positive electrode, electrolytic solution, or separator known in the art may be used. Any positive electrode may be used as long as the positive electrode is one that is usable in a lithium ion secondary battery. The positive electrode includes a current collector, and a positive electrode active material layer bound on the current collector. The positive electrode active material layer contains a positive electrode active material and a binder, and may further contain a conductive additive. The positive electrode active material, the conductive additive, and the binder are not particularly limited, and those usable in a nonaqueous secondary battery may be used.

Examples of the positive electrode active material include metal lithium, a Li compound or a solid solution selected from $LiCoO_2$, $Li_xNi_aCo_bMn_cO_2$, $Li_xCo_bMn_cO_2$, $Li_xNi_aMn_cO_2$, $Li_xNi_aCo_bO_2$, and $Li_2MnO_3$ (note that $0.5 \leq x \leq 1.5$, $0.1 \leq a < 1$, $0.1 \leq b < 1$, and $0.1 \leq c < 1$), $Li_2MnO_3$, and sulfur, etc. As the current collector, one that is generally used for the positive electrode of a lithium ion secondary battery, such as aluminum, nickel, and stainless steel, may be used. As the conductive additive, one that is similar to that described above in relation to the negative electrode may be used.

The electrolytic solution is obtained by dissolving a lithium metal salt, which is an electrolyte, in the organic solvent. As the organic solvent, one or more members selected from aprotic organic solvents such as, for example, propylene carbonate (PC), ethylene carbonate (EC), dimethyl carbonate (DMC), diethyl carbonate (DEC), and ethyl methyl carbonate (EMC) may be used. As the electrolyte to be dissolved, a lithium metal salt that is soluble to the organic solvent, such as $LiPF_6$, $LiBF_4$, $LiAsF_6$, $LiI$, $LiClO_4$, and $LiCF_3SO_3$, may be used.

As the electrolytic solution, for example, a solution obtained by dissolving a lithium metal salt such as $LiClO_4$, $LiPF_6$, $LiBF_4$, or $LiCF_3SO_3$ in an organic solvent such as ethylene carbonate, dimethyl carbonate, propylene carbonate, or dimethyl carbonate at a concentration of about 0.5 mol/L to 1.7 mol/L may be used.

The separator is not particularly limited as long as the separator is one usable in a nonaqueous secondary battery. The separator serves to separate the positive electrode and the negative electrode to retain the electrolytic solution, and a thin microporous film of polyethylene, polypropylene, or the like may be used as the separator.

The form of the secondary battery of the present invention is not particularly limited, and various forms such as a cylinder type, a laminated type, and a coin type, etc., may be used. Even when any of the forms is used, a battery is formed by: making an electrode assembly by interposing the separator between the positive electrode and the negative electrode; respectively connecting a positive electrode current collector to a positive electrode external terminal and a negative electrode current collector to a negative electrode external terminal using current collecting leads or the like; and then sealing the electrode assembly together with the electrolytic solution in a battery case.

EXAMPLES

In the following, embodiments of the present invention will be described specifically by means of Examples and Comparative Examples.

Example 1

Sixty-five milliliters of an HCl aqueous solution having a concentration of 36 mass % was set to a temperature of 0° C. in an ice bath, and 3.3 g of calcium disilicide ($CaSi_2$) was added thereto and the mixed solution was stirred in an argon gas current. After completion of foaming was confirmed, the mixed solution was warmed to room temperature and further stirred for 2 hours at room temperature, then 20 ml of distilled water was added thereto, and the mixed solution was further stirred for 10 minutes. At this moment, suspension of a yellow powder was observed. The obtained mixed solution was filtered, and the residue was rinsed with 10 ml of distilled water, then rinsed with 10 ml of ethanol, and dried under vacuum for 12 hours to obtain 3.5 g of a layered silicon compound.

A Raman spectrum of the layered silicon compound is shown in FIG. 1. Peaks are present at $330 \pm 10$ $cm^{-1}$, $360 \pm 10$ $cm^{-1}$, $498 \pm 10$ $cm^{-1}$, $638 \pm 10$ $cm^{-1}$, and $734 \pm 10$ $cm^{-1}$ of Raman shift.

Then, 2 g of the layered silicon compound was weighed out, and a heat treatment of keeping the layered silicon compound at 500° C. was performed for 12 hours in argon gas in which the amount of $O_2$ was not greater than 1 vol %, to obtain 1.45 g of a brown silicon material. The BET specific surface area of the silicon material was 7.6 m²/g.

Measurement of X-ray diffraction (XRD measurement) using CuKα radiation was conducted on the obtained silicon material. In an XRD chart, three peaks derived from silicon crystallites were present. The crystallite size calculated in accordance with Scherrer's equation from the half width of a diffraction peak (present at a position at which 2θ is 27° to 30°) of the (111) plane was in nanometer order, and the obtained silicon material was a silicon material containing nano-sized silicon crystallites.

When a diffuse reflectance absorption spectrum of the silicon material was measured and the band gap of the silicon material was calculated from the absorption edge wavelength of the diffuse reflectance absorption spectrum, the band gap was 1.6 eV also as shown in Table 1. In addition, the Si/O atom ratio calculated by TEM-EDX was 1/0.36.

Example 2

A silicon material was obtained, using a layered silicon compound produced similarly to Example 1, similarly to Example 1 except that the heat treatment temperature was 700° C.

When the band gap of the silicon material was calculated from the absorption edge wavelength of a light absorption spectrum of the silicon material, the band gap was 1.4 eV also as shown in Table 1. In addition, the Si/O atom ratio calculated by TEM-EDX was 1/0.36.

Example 3

A silicon material was obtained, using a layered silicon compound produced similarly to Example 1, similarly to Example 1 except that the heat treatment temperature was 800° C.

When the band gap of the silicon material was calculated from the absorption edge wavelength of a light absorption spectrum of the silicon material, the band gap was 1.4 eV also as shown in Table 1. In addition, the Si/O atom ratio calculated by TEM-EDX was 1/0.34.

Example 4

A silicon material was obtained, using a layered silicon compound produced similarly to Example 1, similarly to Example 1 except that the heat treatment temperature was 900° C.

When the band gap of the silicon material was calculated from the absorption edge wavelength of a light absorption spectrum of the silicon material, the band gap was 1.3 eV also as shown in Table 1. In addition, the Si/O atom ratio calculated by TEM-EDX was 1/0.34.

Example 5

A silicon material was obtained, using a layered silicon compound produced similarly to Example 1, similarly to Example 1 except that the heat treatment temperature was 300° C.

When the band gap of the silicon material was calculated from the absorption edge wavelength of a light absorption spectrum of the silicon material, the band gap was 2.1 eV also as shown in Table 1. In addition, the Si/O atom ratio calculated by TEM-EDX was 1/0.36.

Example 6

A mixed solution of 2 mL of an HF aqueous solution having a concentration of 46 mass % and 63 mL of an HCl aqueous solution having a concentration of 36 mass % was set to a temperature of 0° C. in an ice bath, and 3.3 g of calcium disilicide ($CaSi_2$) was added thereto and the mixed solution was stirred in an argon gas current. After completion of foaming was confirmed, the mixed solution was warmed to room temperature and further stirred for 2 hours at room temperature, then 20 ml of distilled water was added thereto, and the mixed solution was further stirred for 10 minutes. At this moment, suspension of a yellow powder was observed.

The obtained mixed solution was filtered, and the residue was rinsed with 10 ml of distilled water, then rinsed with 10 ml of ethanol, and vacuum dried to obtain 2.5 g of a layered silicon compound.

Then, 1 g of the layered silicon compound was weighed out, and a heat treatment of keeping the layered silicon compound at 500° C. was performed for 12 hours in argon gas in which the amount of $O_2$ was not greater than 1 vol %, to obtain 0.7 g of a brown silicon material.

When the band gap of the silicon material was calculated from the absorption edge wavelength of a light absorption spectrum of the silicon material, the band gap was 1.6 eV also as shown in Table 1. In addition, the Si/O atom ratio calculated by TEM-EDX was 1/0.15.

Example 7

A silicon material was obtained, using a layered silicon compound produced similarly to Example 6, similarly to Example 6 except that the heat treatment temperature was 700° C.

When the band gap of the silicon material was calculated from the absorption edge wavelength of a light absorption spectrum of the silicon material, the band gap was 1.4 eV also as shown in Table 1. In addition, the Si/O atom ratio calculated by TEM-EDX was 1/0.21.

Example 8

A silicon material was obtained, using a layered silicon compound produced similarly to Example 6, similarly to Example 6 except that the heat treatment temperature was 900° C.

When the band gap of the silicon material was calculated from the absorption edge wavelength of a light absorption spectrum of the silicon material, the band gap was 1.2 eV also as shown in Table 1. In addition, the Si/O atom ratio calculated by TEM-EDX was 1/0.12.

Example 9

A silicon material was obtained, using a layered silicon compound produced similarly to Example 6, similarly to Example 6 except that the heat treatment temperature was 300° C.

When the band gap of the silicon material was calculated from the absorption edge wavelength of a light absorption spectrum of the silicon material, the band gap was 2.1 eV also as shown in Table 1. In addition, the Si/O atom ratio calculated by TEM-EDX was 1/0.16.

Comparative Example 1

A commercially available crystal silicon (manufactured by RARE METALLIC Co., Ltd.) was used as Comparative Example 1. When the band gap of the crystal silicon is calculated from the absorption edge wavelength of a light absorption spectrum of the crystal silicon, the band gap was 1.1 eV also as shown in Table 1.

Comparative Example 2

Commercially available $SiO_x$ (x=0.5 to 1.6) ("Silicon Oxide", manufactured by OSAKA Titanium Technologies Co., Ltd.) was used as Comparative Example 2. When the band gap of the $SiO_x$ is calculated from the absorption edge wavelength of a light absorption spectrum of the $SiO_x$, the band gap was 1.8 eV also as shown in Table 1. The Si/O atom ratio is 1/1.1.

<Production of Battery>

A slurry was prepared by mixing 45 parts by mass of each of the silicon materials of the respective Examples and the respective Comparative Examples, 40 parts by mass of a natural graphite powder, 5 parts by mass of acetylene black, and 33 parts by mass of a binder solution. As the binder solution, a solution in which a polyamide-imide (PAI) resin was dissolved in N-methyl-2-pyrrolidone (NMP) in 30 mass % is used. Each of these slurries was applied on the surface of an electrolytic copper foil (current collector) having a thickness of approximately 20 μm by using a doctor blade, and dried to form a negative electrode active material layer on the copper foil. Then, the current collector and the negative electrode active material layer were firmly adhered and joined by using a roll press machine. Each obtained joined object was vacuum dried at 100° C. for 2 hours to form a negative electrode in which the weight per area of the negative electrode active material layer was 2.0 mg/cm² and the electrode density was 1.0 g/cm³.

A lithium secondary battery (half cell) was produced by using, as an evaluation electrode, each negative electrode produced by the above-described procedure. A metal lithium foil (thickness: 500 μm) was used as a counter electrode. The counter electrode and the evaluation electrode were respectively cut to have diameters of 13 mm and 11 mm, and a separator (a glass filter manufactured by the Hoechst Celanese Corp., and "Celgard 2400" manufactured by Celgard LLC.) was interposed between both electrodes to form an electrode assembly battery. The electrode assembly battery was housed in a battery case (a member for CR2032 type coin batteries, manufactured by Hohsen Corp.). A nonaqueous electrolytic solution obtained by dissolving $LiPF_6$ at a concentration of 1 M in a mixed solvent in which ethylene carbonate and diethyl carbonate were mixed at 1:1 (volume ratio) was poured in the battery case, and then the battery case was sealed to obtain a lithium secondary battery.

<Battery Characteristic Test>

For the lithium secondary batteries of the respective Examples and the respective Comparative Examples, 50 cycles of a charge/discharge test was conducted under the conditions of current: 0.1 C and voltage: 0.01 to 0.8 V. The initial charge capacity and discharge capacity were measured, initial efficiency (100×discharge capacity/charge capacity) was calculated, and the results are shown in Table 1. A capacity retention rate that is a proportion of discharge capacity after 50 cycles with respect to the initial discharge capacity was calculated, and is shown as life in Table 1. Furthermore, a relationship between the band gap and the capacity retention rate is shown in FIG. 2, and a relationship between the band gap and the initial efficiency is shown in FIG. 3.

Figure 2:
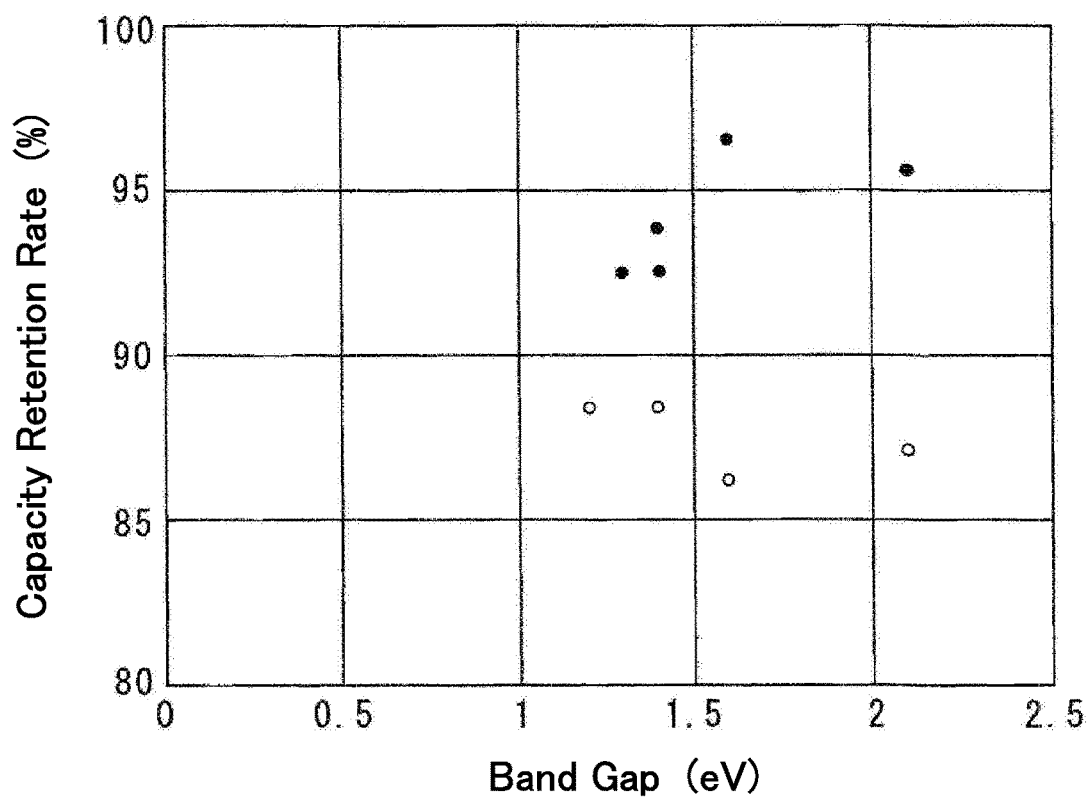
FIG. 2 is a graph showing a relationship between a band gap and a capacity retention rate.
Figure 3:
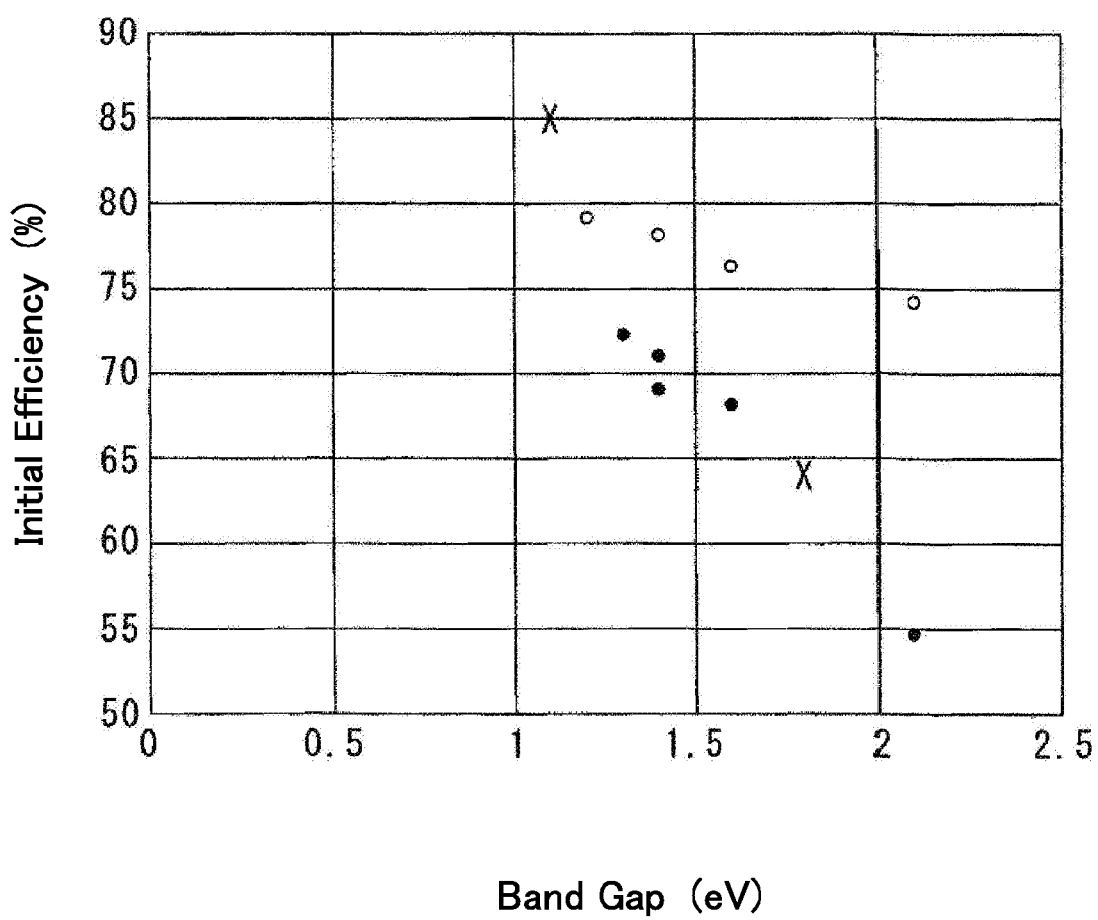
FIG. 3 is a graph showing a relationship between the band gap and initial efficiency.

In FIGS. 2 and 3, each black circle indicates the lithium secondary battery in which a silicon material obtained by using only hydrochloric acid (HCl) as an acid type was used, and each white circle indicates the lithium secondary battery in which a silicon material obtained by using a mixture of hydrochloric acid (HCl) and hydrofluoric acid (HF) as an acid type was used. In addition, x indicates Si or $SiO_x$.

TABLE 1

|  | Acid type or sample | Heat treatment temperature (° C.) | Band gap (eV) | Initial efficiency (%) | Initial capacity (mAh/g) | Life (%) | Si/O atom ratio |
| --- | --- | --- | --- | --- | --- | --- | --- |
| Example 1 | HCl | 500 | 1.6 | 68.1 | 985 | 96.5 | 1/0.36 |
| Example 2 | HCl | 700 | 1.4 | 69.1 | 994 | 92.5 | 1/0.36 |
| Example 3 | HCl | 800 | 1.4 | 71.1 | 933 | 93.8 | 1/0.34 |
| Example 4 | HCl | 900 | 1.3 | 72.3 | 987 | 92.5 | 1/0.34 |
| Example 5 | HCl | 300 | 2.1 | 54.6 | 879 | 95.6 | 1/0.36 |
| Example 6 | HF/HCl | 500 | 1.6 | 76.3 | 1304 | 86.3 | 1/0.15 |
| Example 7 | HF/HCl | 700 | 1.4 | 78.1 | 1428 | 88.4 | 1/0.21 |
| Example 8 | HF/HCl | 900 | 1.2 | 79.2 | 1448 | 88.3 | 1/0.12 |
| Example 9 | HF/HCl | 300 | 2.1 | 74.2 | 1185 | 87.2 | 1/0.16 |
| Comparative Example 1 | Si | — | 1.1 | 85 | 1852 | 5 | — |
| Comparative Example 2 | $SiO_x$ | — | 1.8 | 64 | 698 | 95 | 1/1.1 |

From Table 1 and FIG. 2, a tendency in which the life extends as the band gap increases is recognized in Examples 1 to 5. The life is found to be suitable when the band gap is within the range of greater than 1.1 eV and not greater than 2.1 eV as in Examples 1 to 9 and Comparative Example 2. However, when the Si/O atom ratio is not greater than 1/0.5 as in Comparative Example 2, the initial capacity becomes low. On the other hand, from FIG. 3, a tendency in which the initial efficiency decreases as the band gap increases was recognized.

INDUSTRIAL APPLICABILITY

The silicon material of the present invention can be utilized as the negative electrode active material of an electrical storage device such as secondary batteries, electric double layer capacitors, lithium ion capacitors, and the like. The secondary battery is useful as a nonaqueous secondary battery utilized for driving motors of electric vehicles and hybrid automobiles and for personal computers, portable communication devices, home appliance, office instrument, industrial instrument, and the like, and can be suitably used particularly for driving motors of electric vehicles and hybrid automobiles requiring large capacity and large output.

Furthermore, the degree of freedom of the heat treatment temperature is high, and the silicon material of the present invention can be composited with another material by controlling the magnitude of the specific surface area thereof. Thus, the silicon material of the present invention can be utilized as a semiconductor material such as for CMOS and semiconductor memory, a solar battery material, and a photocatalyst material, etc.

The invention claimed is:

1. A silicon material having an Si/O atom ratio within a range of greater than 1/0.5 and not greater than 1/0.1 and a band gap within a range of greater than 1.1 eV and not greater than 2.1 eV, wherein the silicon material has a BET specific surface area of 3 to 100 m2/g.

2. The silicon material according to claim 1, wherein the silicon material contains nano-sized silicon crystallites.

3. The silicon material according to claim 2, wherein the silicon crystallites have a crystallite size of 0.5 nm to 300 nm.

4. The silicon material according to claim 2, wherein the silicon material is complex particles further containing at least one of amorphous silicon, a silicon oxide (SiOx, 021 x<2), or a silicon compound.

5. The silicon material according to claim 4, wherein the silicon crystallites are present on a surface of and/or within the at least one of the amorphous silicon, the silicon oxide (SiOx, 0<x<2), or the silicon compound.

6. The silicon material according to claim 4, wherein the silicon crystallites are dispersed in an island state within a matrix mainly formed from amorphous silicon, or adhere to surfaces of particles mainly formed from amorphous silicon, in an island state.

7. The silicon material according to claim 1, wherein a contained oxygen (O) amount in the silicon material is not greater than 20 mass %.

8. A negative electrode active material composed of the silicon material according to claim 1.

9. A negative electrode containing the negative electrode active material according to claim 8.

10. A secondary battery comprising the negative electrode according to claim 9.

* * * * *

UNITED STATES PATENT AND TRADEMARK OFFICE
CERTIFICATE OF CORRECTION

PATENT NO. : 10,217,990 B2  
APPLICATION NO. : 15/314246  
DATED : February 26, 2019  
INVENTOR(S) : Takashi Mohri et al.

Page 1 of 1

It is certified that error appears in the above-identified patent and that said Letters Patent is hereby corrected as shown below:

In the Claims

Column 15, Line 24:  
Delete "specific surface area of 3 to 100 m2/g"  
Insert --specific surface area of 3 to 100 m$^2$/g--

Column 16, Lines 6 to 7:  
Delete "least one of amorphous silicon, a silicon oxide (SiOx, 021x<2), or a silicon compound"  
Insert --least one of amorphous silicon, a silicon oxide (SiOx, 0<x<2), or a silicon compound--

Signed and Sealed this  
Seventh Day of May, 2019

Andrei Iancu  
*Director of the United States Patent and Trademark Office*